United States Patent
Crop et al.

(10) Patent No.: US 7,340,657 B2
(45) Date of Patent: Mar. 4, 2008

(54) ON-CHIP HIGH-SPEED SERIAL DATA ANALYZERS, SYSTEMS, AND ASSOCIATED METHODS

(75) Inventors: Jared W. Crop, Chandler, AZ (US); David J. O'dell, Gilbert, AZ (US); Mike D. Wang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 520 days.

(21) Appl. No.: 11/026,546

(22) Filed: Dec. 30, 2004

(65) Prior Publication Data
US 2006/0190783 A1 Aug. 24, 2006

(51) Int. Cl.
*G01R 31/28* (2006.01)

(52) U.S. Cl. ............. 714/724; 714/799; 714/812; 714/821; 375/236; 375/286

(58) Field of Classification Search ............... None
See application file for complete search history.

(56) References Cited

U.S. PATENT DOCUMENTS

| | | | | |
|---|---|---|---|---|
| 5,644,569 A | * | 7/1997 | Walker | 370/473 |
| 5,734,341 A | * | 3/1998 | Walker | 341/95 |
| 5,805,087 A | * | 9/1998 | Walker | 341/95 |
| 7,089,485 B2 | * | 8/2006 | Azadet et al. | 714/798 |

\* cited by examiner

*Primary Examiner*—Cynthia Britt
*Assistant Examiner*—Steven D. Radosevich
(74) *Attorney, Agent, or Firm*—Schwegman, Lundberg & Woessner, P.A.

(57) ABSTRACT

In an embodiment, a method includes forming a plurality of time/voltage points from a number of voltage values and from a number of time values, generating serialized data having a predetermined number of bits, comparing the serialized data to a set predetermined voltage to produce analysis data, and capturing the analysis data at a respective time data point of a plurality of time data points. The method may be implemented as part of integrated circuits, electronic assemblies, or systems.

23 Claims, 7 Drawing Sheets

ON-CHIP HIGH-SPEED SERIAL DATA ANALYZERS, SYSTEMS, AND ASSOCIATED METHODS

TECHNICAL FIELD

Embodiments of the present apparatus and method relate in general to serial data analyzers, and, in particular, to serial data analyzers that include built-in self tests.

BACKGROUND

An "eye diagram" may depict a transmitter output of a serial bus. Data that is generated from a register file, RAM (random access memory), or linear feedback shift register is sent through the transmitter. The output of the transmitter is characterized over time and voltage by taking multiple samples at each time/voltage point. Known methods require that output data be compared to input data, and thus are not independent on logic and line delays.

It is therefore a drawback of the prior art that output data must be compared to input data, and that they are subjected to logic and line delays.

BRIEF DESCRIPTION OF THE DRAWINGS

Embodiments of the present inventive subject matter may be best understood by referring to the following description and accompanying drawings, which illustrate such embodiments. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Such embodiments of the inventive subject matter may be referred to, individually and/or collectively, herein by the term "invention" merely for convenience and without intending to voluntarily limit the scope of this application to any single invention or inventive concept if more than one is in fact disclosed.

Figure 1:
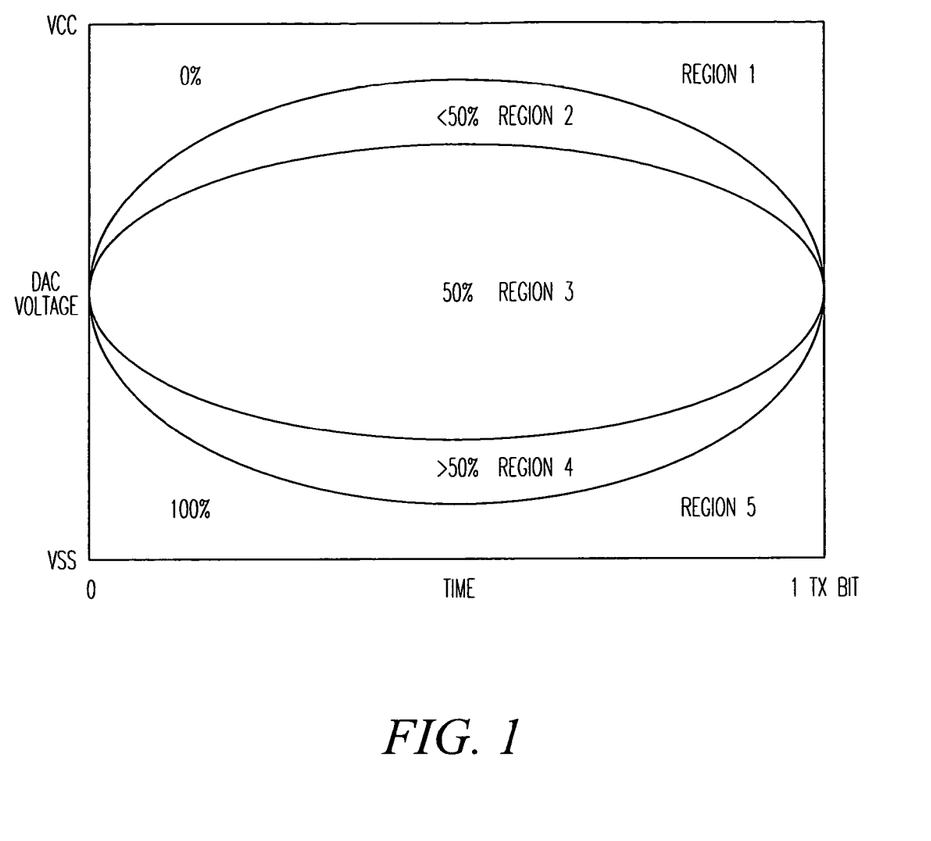
FIG. 1 is an "eye diagram" that depicts how embodiments of the inventive subject matter characterize a transmitter output of a serial bus.

FIG. 1 is an "eye diagram" that depicts how embodiments of the inventive subject matter characterize a transmitter output of a serial bus. Data that is generated from a register file, RAM (random access memory), or linear feedback shift register is sent through the transmitter. The output of the transmitter is characterized over time and voltage by taking multiple samples at each time/voltage point. Each sample is characterized by counting the number of logical ones (i.e., a given logical state) at each time/voltage point. FIG. 1 shows the expected count for each time/voltage point where each region represents the percent of logical ones detected. For example, if 1000 samples are taken and there are an equal number of ones and zeros sent, then a count of 0 is expected in region 1, a count of less than 500 is expected in region 2, a count of 500 is expected in region 3, a count of greater than 500 is expected in region 4 and a count of 1000 is expected in region 5.

An advantage of embodiments of the inventive subject matter over the current "eye diagram" that is being used in the industry is that the inventive subject matter does not require the hardware to compare the data against known data. This reduces gate count and also makes the measurement independent of circuit and/or line delays.

Embodiments of the present method and apparatus may use 8 bit-10 bit data, or at least 10 bit data that is DC balanced. Embodiments may require that the input data to the transmitter have an equal number of 1's and 0's. Otherwise the percentages in FIG. 1 will be incorrect. In other words, DC balanced data makes it possible to create the eye without comparing input and output data.

Figure 2:
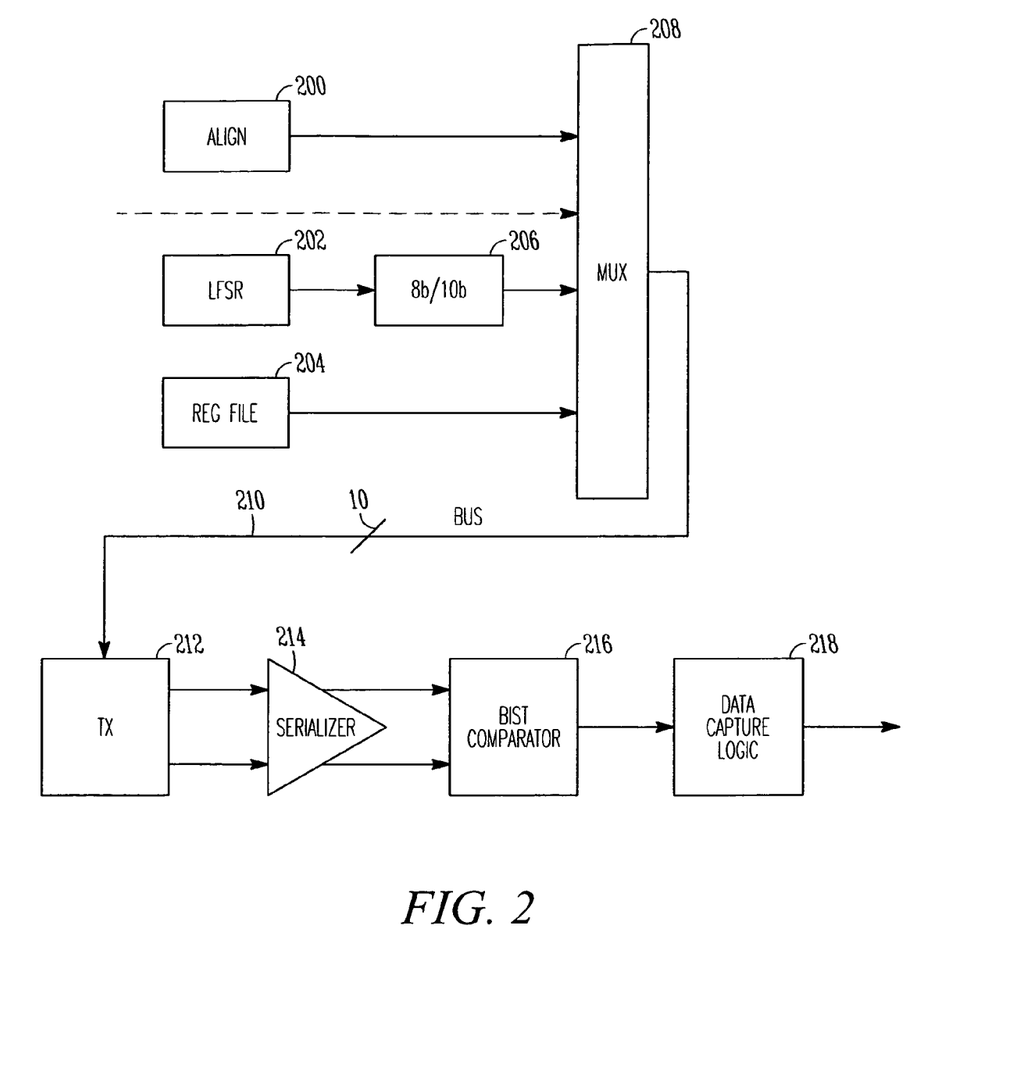
FIG. 2 depicts a hardware flow diagram of an embodiment of the inventive subject matter.

FIG. 2 depicts a hardware flow diagram of an embodiment of the inventive subject matter. Data may be generated from different sources, such as a register file 204, an ALIGN 200, or a linear feedback shift register 202 (which as depicted provides a second data stream via 8 b/10 b element 206). This data may be sent over the bus 210 via a multiplexer (MUX) 208 to a transmitter 212.

The transmitter 212 may output the 10-bit data to a serializer 214 where the data may be serialized and sent to a BIST comparator 216. The BIST comparator 216 may then compare the data to a set DAC voltage, and data capture logic 218 may then capture the resulting data at a single point in time. This may happen for a programmable number of times for each data point. Some embodiments may use 64 voltage values (programmed in the DAC 304, see FIG. 3) and 64 time values (programmed in the clock generator 306, FIG. 3) for each bit position.

Figure 3:
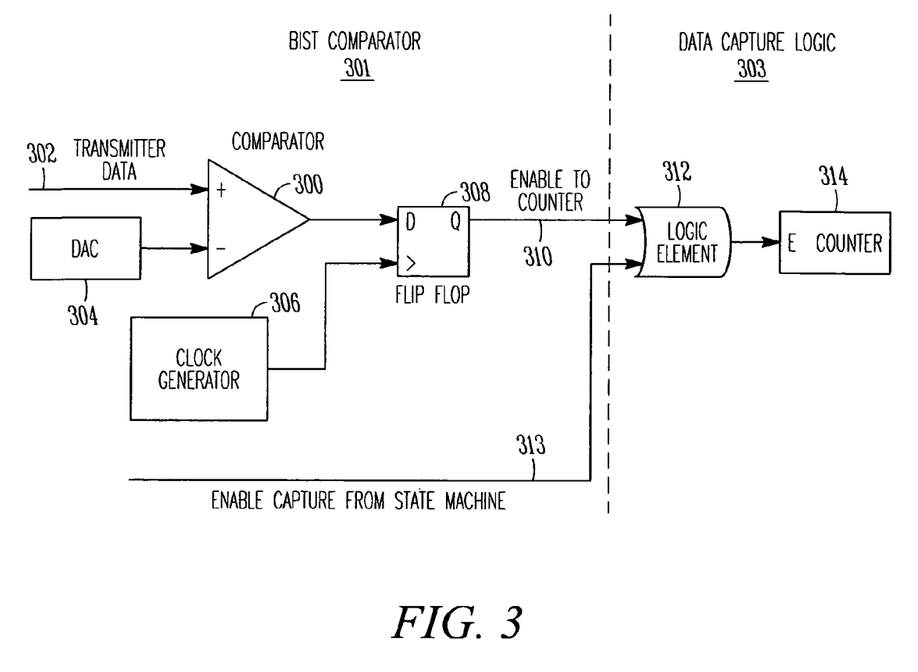
FIG. 3 depicts a block diagram of a BIST comparator and of data capture logic of the inventive subject matter.

FIG. 3 depicts a block diagram of a BIST comparator 301 and data capture logic 303 of the inventive subject matter. A BIST comparator 300 may have a pair of inputs respectively coupled to transmitter data 302 and to a digital-to-analog converter (DAC) 304. A D-type flip-flop 308 may have its inputs respectively coupled to an output of the comparator 300 and to a clock generator 306. A logic element 312 may have a pair of inputs that respectively receive an "enable to counter signal" 310 from the D-type flip-flop 308 and an "enable capture from state-machine" signal 313. A counter 314 may have an input operatively coupled to an output of the logic element 312.

In this embodiment depicted in FIG. 3, the logic element 312 and the counter 314 form the data capture logic 303. The other components depicted in FIG. 3 form a BIST comparator 301.

Figure 4:
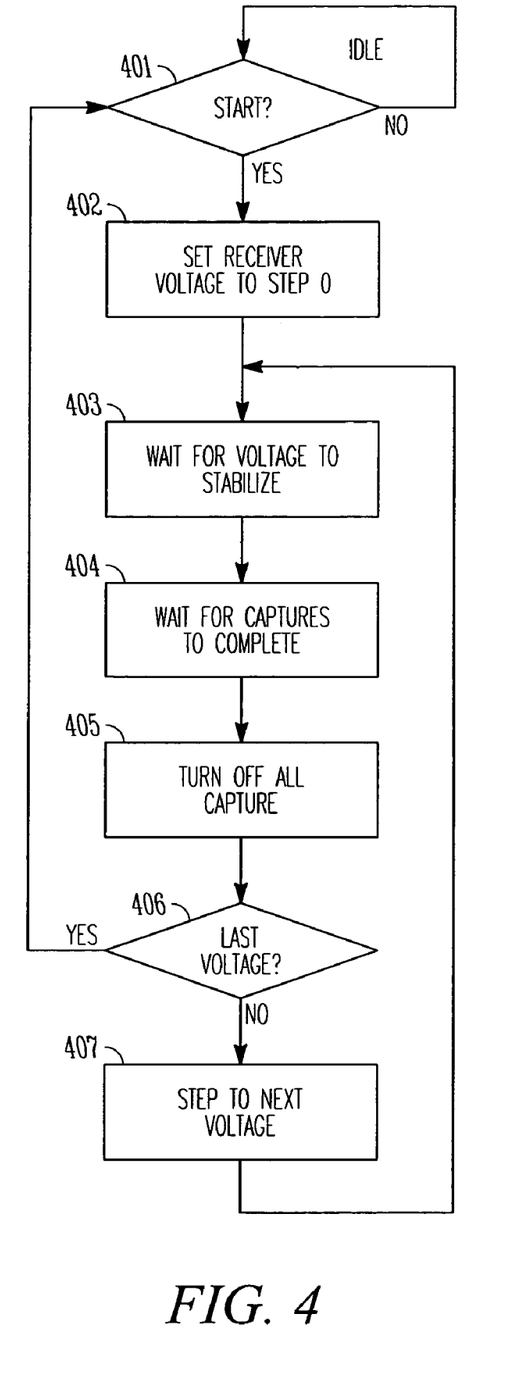
FIG. 4 is a state-machine diagram for data capture logic in an embodiment of the inventive subject matter.

FIG. 4 is a state-machine diagram for data capture logic in an embodiment of the inventive subject matter. The system idles until it receives a start signal (401). After the system starts, a receiver voltage is set to a step 0 (402). The system then waits for the voltage to stabilize (403). Next, the system waits for captures to be completed (404). When they are completed, all capture is turned off (405).

A check (406) is made as to whether a last voltage has been reached. If it has, then the system is returned to the idle mode (401). If the last voltage has not been reached, then the system steps to the next voltage (407) and returns to waiting for the voltage to stabilize (403).

Figure 5:
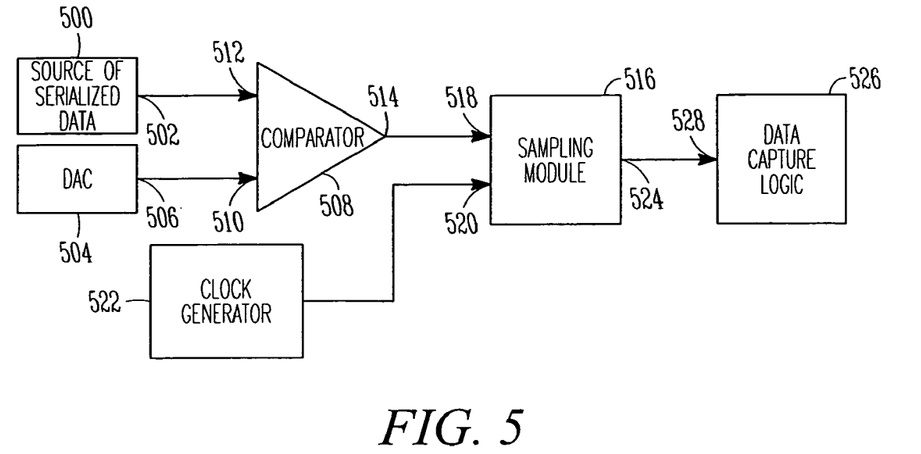
FIG. 5 depicts an embodiment of the inventive subject matter.

FIG. 5 depicts an embodiment of the inventive subject matter. This embodiment may have in general a source of serialized data 500, the source 500 having an output 502 to provide the serialized data; a digital-to-analog converter (DAC) 504 having an output 506 to provide at least one DAC voltage value; a comparator 508 having a first input 510 operatively coupled to the output 506 of the DAC converter 504, having a second input 512 operatively coupled to the output 502 of the source 500, and having an output 514, the comparator 508 comparing the serialized data with the at least one DAC voltage value; a sampling module 516 having a first input 518 operatively coupled to the output 514 of the comparator 508, having a second input 520 operatively coupled to a clock generator 522, and having an output 524; and data capture logic 526 having an input 528 operatively coupled to the output 524 of the sampling module 516.

Embodiments of the inventive subject matter may further comprise a plurality of time/voltage points formed from a number of DAC voltage values and from a number of time values. A plurality of samples of the serialized data may be taken at each of a plurality of time/voltage points. Then, a number of logical states may be counted for each sample of the plurality of samples at each of the plurality of time/voltage points to produce analysis data. The number of DAC voltage values and the number of time values may be programmable.

Embodiments of the inventive subject matter may also comprise a plurality of samples of the serialized data for each of a plurality of time/voltage points. Embodiments may further comprise a count of a number of logical states for each sample of the plurality of samples at each of the plurality of time/voltage points to produce analysis data. The analysis data may be captured for each time value of the number of time values.

In embodiments of the inventive subject matter the number of DAC voltage values and the number of time values may be used for each bit position of the serialized data. The number of DAC voltage values may be 64, and the number of time values may be 64.

Figure 6:
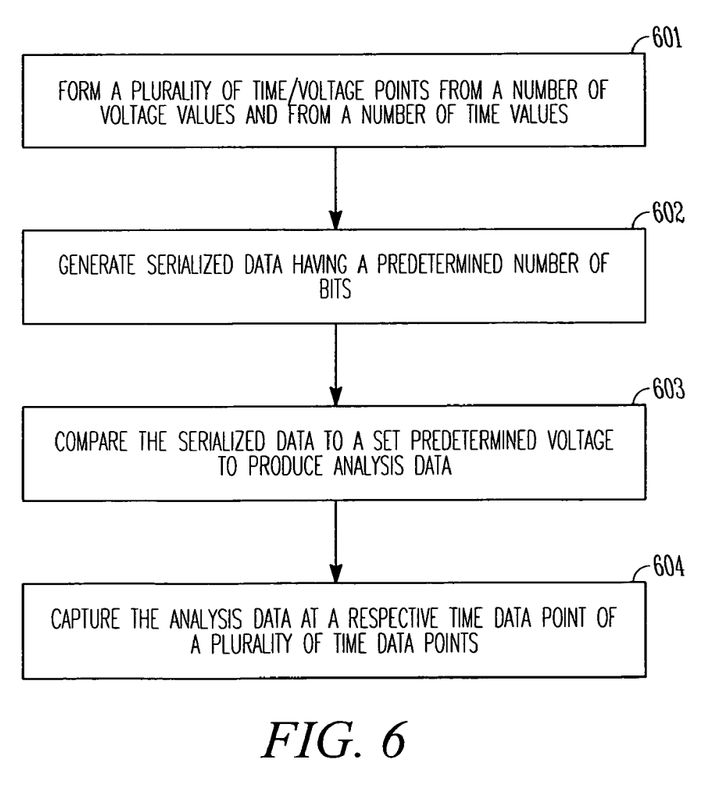
FIG. 6 depicts several methods of the inventive subject matter.

FIG. 6 depicts several methods of the inventive subject matter. Such methods may comprise forming a plurality of time/voltage points from a number of voltage values and from a number of time values (601); generating serialized data having a predetermined number of bits (602); comparing the serialized data to a set predetermined voltage to produce analysis data (603); and capturing the analysis data at a respective time data point of a plurality of time data points (604).

Furthermore, in embodiments of the inventive subject matter analysis data may be captured a programmable number of times for each time data point of the plurality of time data points. Also, embodiments may further comprise taking a plurality of samples of the serialized data at each of a plurality of time/voltage points.

Again, in embodiments of the inventive subject matter the serialized data may have a plurality of bit positions, and the number of voltage values and the number of time values may be used for each bit position of the serialized data. The number of voltage values and the number of time values may be programmable. In some embodiments the number of voltage values may be 64, and the number of time values may be 64.

Figure 7:
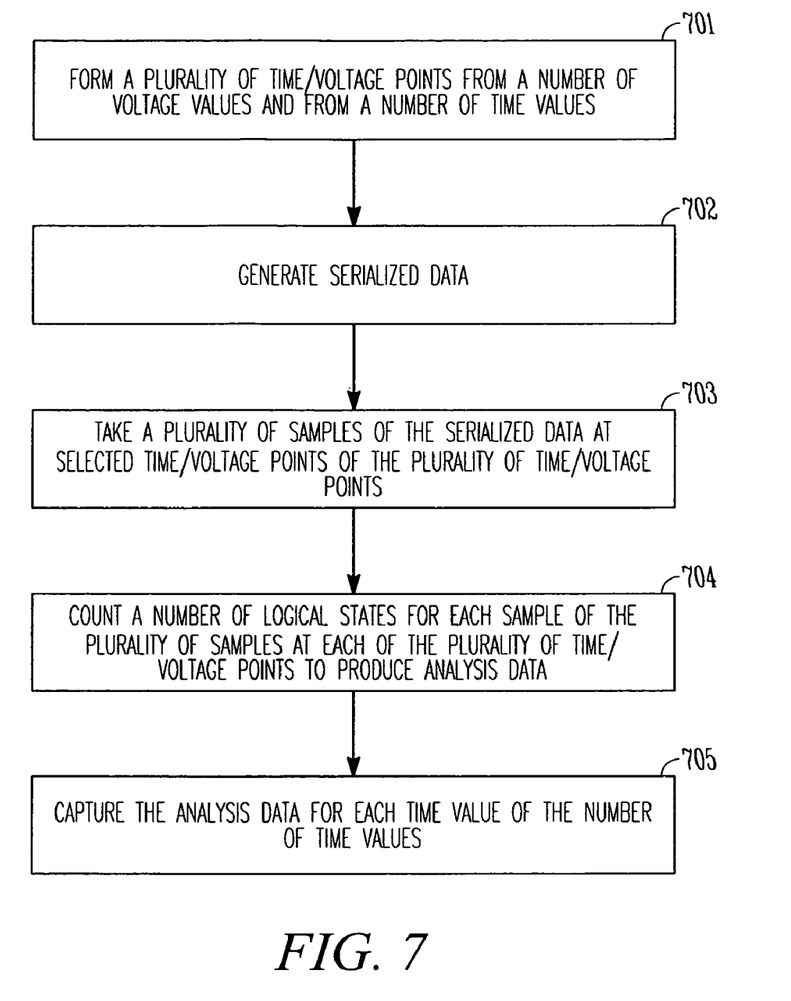
FIG. 7 depicts several methods of the inventive subject matter.

FIG. 7 depicts several methods of the inventive subject matter. Such methods may comprise forming a plurality of time/voltage points from a number of voltage values and from a number of time values (701); generating serialized data (702); taking a plurality of samples of the serialized data at selected time/voltage points of the plurality of time/voltage points (703); counting a number of logical states for each sample of the plurality of samples at each of the plurality of time/voltage points to produce analysis data (704); and capturing the analysis data for each time value of the number of time values (705).

Furthermore, in embodiments of the inventive subject matter the serialized data may have a plurality of bit positions, and the number of voltage values and the number of time values may be used for each bit position of the serialized data. The number of voltage values and the number of time values may be programmable. In some embodiments the number of voltage values may be 64, and the number of time values may be 64.

Figure 8:
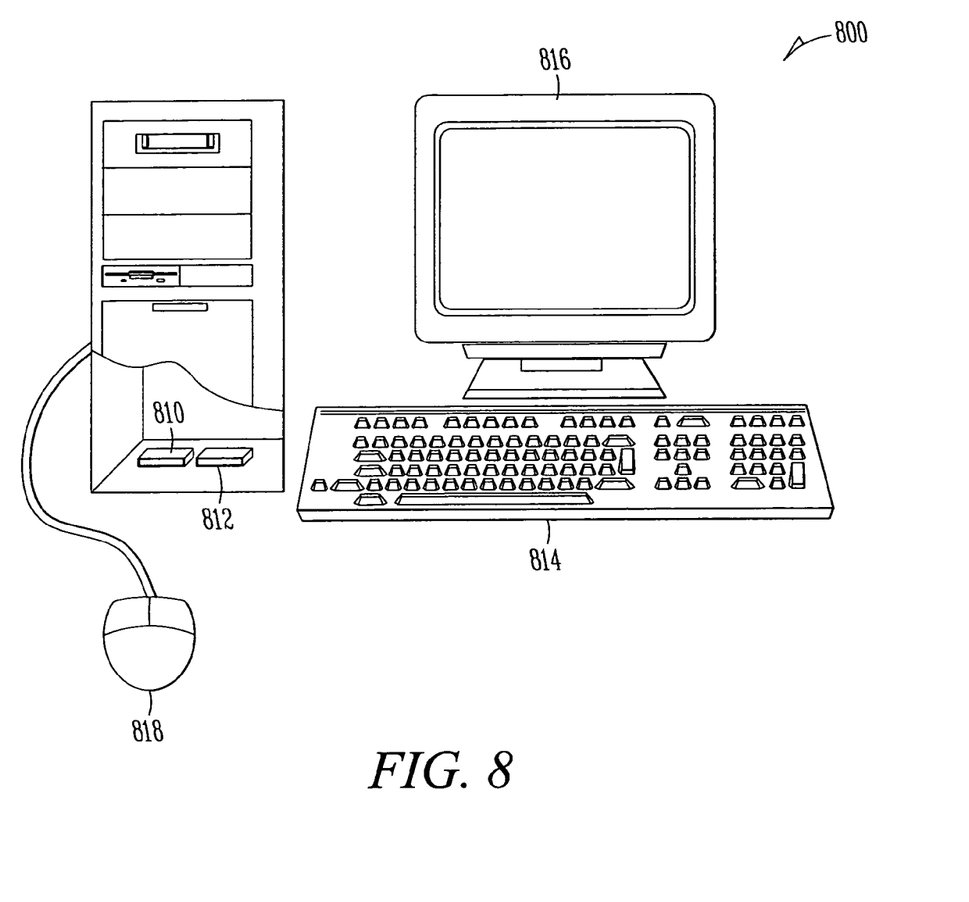
FIG. 8 depicts a computing system according to an embodiment.

FIG. 8 is a depiction of a computing system 800 according to the inventive subject matter. One or more of the foregoing embodiments of an integrated circuit having a serial data analyzer may be utilized in a computing system, such as a computing system 800 of FIG. 8. The computing system 800 includes at least one processor (not pictured), which may be part of an electronic assembly that includes an integrated circuit package 810, a memory or data storage system 812, at least one input device such as keyboard 814, and at least one output device such as display 816, for example. The computing system 800 includes a processor that processes data signals, and may include, for example, a microprocessor available from Intel Corporation. In addition to the keyboard 814, the computing system 800 can include another user input device such as a mouse 818, for example.

For purposes of this disclosure, a computing system 800 embodying components in accordance with the claimed subject matter may include one or more elements at any hierarchical level that utilize serial data analyzers, such as but not limited to a die that contains a digital signal processor (DSP), a micro-controller, an application specific integrated circuit (ASIC), or a microprocessor.

Embodiments set forth in this disclosure may be applied to devices and apparatuses other than a traditional computer. For example, a die may be packaged in a portable device such as a wireless communicator or a hand-held device such as a personal digital assistant and the like. Another example is a die that can be packaged in a vehicle.

Embodiments of the inventive subject matter allow the transmitter outputs of high-speed interfaces to be characterized and tested without being connected to tester pins. This allows chips to be tested on a lower cost tester. At the present time, for example, the cost saving is estimated to be 6 cents per second.

Embodiments of the inventive subject matter may overcome drawbacks of the prior art in that these embodiments do not require the output data to be compared to the input data, and they are independent of logic and line delays.

The operations described herein are just exemplary. There may be many variations to these operations without departing from the spirit of the inventive subject matter. For instance, the operations may be performed in a differing order, or operations may be added, deleted, or modified.

Although exemplary implementations of the inventive subject matter have been depicted and described in detail herein, it will be apparent to those skilled in the relevant art that various modifications, additions, substitutions, and the like can be made without departing from the spirit of the inventive subject matter, and these are therefore considered to be within the scope of the inventive subject matter as defined in the following claims.

What is claimed is:

1. A method comprising:
   forming a plurality of time/voltage points from a number of voltage values and from a number of time values;
   generating serialized data;
   taking a plurality of samples of the serialized data at selected time/voltage points of the plurality of time/voltage points;
   counting a number of logical states for each sample of the plurality of samples at each of the plurality of time/voltage points to produce analysis data; and
   capturing the analysis data for each time value of the number of time values.

2. The method according to claim 1, wherein the serialized data has a plurality of bit positions, and wherein the number of voltage values and the number of time values is used for each bit position of the serialized data.

3. The method according to claim 1, wherein the number of voltage values and the number of time values are programmable.

4. The method according to claim 1, wherein the number of voltage values is 64, and wherein the number of time values is 64.

5. A method comprising:
   forming a plurality of time/voltage points from a number of voltage values and from a number of time values;
   generating serialized data having a predetermined number of bits;
   comparing the serialized data to a set predetermined voltage to produce analysis data; and
   capturing the analysis data at a respective time data point of a plurality of time data points.

6. The method according to claim 5, wherein the analysis data is captured a programmable number of times for each time data point of the plurality of time data points.

7. The method according to claim 5, wherein the method further comprises taking a plurality of samples of the serialized data at each of a plurality of time/voltage points.

8. The method according to claim 7, wherein the number of voltage values and the number of time values are programmable.

9. The method according to claim 7, wherein the number of voltage values and the number of time values is used for each bit position of the serialized data.

10. The method according to claim 7, wherein the number of voltage values is 64, and wherein the number of time values is 64.

11. An integrated circuit comprising:
    a source of serialized data, the source having an output to provide the serialized data;
    a digital-to-analog converter (DAC) having an output to provide at least one DAC voltage value;
    a comparator having a first input operatively coupled to the output of the DAC, having a second input operatively coupled to the output of the source, and having an output, the comparator comparing the serialized data with the at least one DAC voltage value;
    a sampling module having a first input operatively coupled to the output of the comparator, having a second input operatively coupled to a clock generator, and having an output; and
    data capture logic having an input operatively coupled to the output of the sampling module.

12. The integrated circuit according to claim 11, wherein the integrated circuit further comprises a plurality of time/voltage points formed from a number of DAC voltage values and from a number of time values.

13. The integrated circuit according to claim 12, wherein a plurality of samples of the serialized data is taken at each of a plurality of time/voltage points.

14. The integrated circuit according to claim 12, wherein a number of logical states is counted for each sample of the plurality of samples at each of the plurality of time/voltage points to produce analysis data.

15. The integrated circuit according to claim 12, wherein the number of DAC voltage values and the number of time values are programmable.

16. The integrated circuit according to claim 12, wherein the integrated circuit further comprises a plurality of samples of the serialized data for each of a plurality of time/voltage points.

17. The integrated circuit according to claim 12, wherein the integrated circuit further comprises a count of a number of logical states for each sample of the plurality of samples at each of the plurality of time/voltage points to produce analysis data.

18. The integrated circuit according to claim 12, wherein the analysis data is captured for each time value of the number of time values.

19. The integrated circuit according to claim 12, wherein the number of DAC voltage values and the number of time values are used for each bit position of the serialized data.

20. The integrated circuit according to claim 12, wherein the number of DAC voltage values is 64, and wherein the number of time values is 64.

21. A system comprising:
    a bus;
    a display coupled to the bus;
    a memory coupled to the bus; and
    a processor coupled to the bus and having an electronic assembly including at least one integrated circuit having:
       a source of serialized data, the source having an output to provide the serialized data;
       a digital-to-analog converter (DAC) having an output to provide at least one DAC voltage value;
       a comparator having a first input operatively coupled to the output of the DAC, having a second input operatively coupled to the output of the source, and having an output, the comparator comparing the serialized data with the at least one DAC voltage value;
       a sampling module having a first input operatively coupled to the output of the comparator, having a second input operatively coupled to a clock generator, and having an output; and
       data capture logic having an input operatively coupled to the output of the sampling module.

22. The system according to claim 21, wherein the integrated circuit further comprises a plurality of time/voltage points formed from a number of DAC voltage values and from a number of time values.

23. The system according to claim 22, wherein a plurality of samples of the serialized data is taken at each of a plurality of time/voltage points.

* * * * *